(12) United States Patent
Myers et al.

(10) Patent No.: US 7,355,277 B2
(45) Date of Patent: Apr. 8, 2008

(54) APPARATUS AND METHOD INTEGRATING AN ELECTRO-OSMOTIC PUMP AND MICROCHANNEL ASSEMBLY INTO A DIE PACKAGE

(75) Inventors: Alan M. Myers, Menlo Park, CA (US); R. Scott List, Beaverton, OR (US); Gilroy J. Vandentop, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,224

(22) Filed: Dec. 31, 2003

(65) Prior Publication Data

US 2005/0139996 A1 Jun. 30, 2005

(51) Int. Cl.
*H01L 23/34* (2006.01)
(52) U.S. Cl. ................. 257/712; 257/714; 257/E23.098
(58) Field of Classification Search ................. 257/712, 257/714, E23.098
See application file for complete search history.

(56) References Cited

U.S. PATENT DOCUMENTS

| | | | |
|---|---|---|---|
| 5,504,924 A | 4/1996 | Ohashi et al. | |
| 5,763,951 A | 6/1998 | Hamilton et al. | |
| 5,875,037 A * | 2/1999 | Murata et al. | ............. 358/400 |
| 6,234,240 B1 | 5/2001 | Cheon | |
| 6,277,629 B1 | 8/2001 | Wolf et al. | |
| 6,285,550 B1 | 9/2001 | Belady | |
| 6,507,492 B2 | 1/2003 | Morris et al. | |
| 6,606,251 B1 | 8/2003 | Kenny et al. | |
| 6,628,340 B1 * | 9/2003 | Graczyk et al. | ............ 348/552 |
| 6,719,868 B1 * | 4/2004 | Schueller et al. | ........ 156/272.6 |
| 6,861,274 B2 | 3/2005 | List et al. | |
| 2004/0120827 A1 * | 6/2004 | Kim et al. | .................... 417/48 |
| 2005/0062150 A1 * | 3/2005 | Kim et al | .................... 257/714 |

OTHER PUBLICATIONS

Banerjee, K, et al., "3-D ICs: a novel chip design for improving deep-submicrometer interconnect performance and systems-on-chip integration", *Proceedings of the IEEE*, 89(5), (May 2001),602-33.
Burgreen, D, et al., "Electrokinetic Flow in Ultrafine Capillary Slits", *Journal of Physical Chemistry*, 68(5), (1964),1084-1091.
Chen, Chuan-Hua, et al., "A planar electroosmotic micropump", *Journal of Microelectromechanical Systems*, 11(6), (Dec. 2002),672-83.
Laser, D J., et al., "High-Frequency Actuation with Silicon Electroosmotic Micropumps", *2002 Solid-state sensor, actuator, and microsystems-Workshop*, Hilton Head SC, (2002),231-234.
Murakami, Yoichi, et al., "Parametric Optimization of Multichanneled Heat Sinks for VLSI Chip Cooling", *IEEE Transactions on Components and Packaging Technologies*, 24, (2001),2-9.

(Continued)

*Primary Examiner*—T. N. Quach
(74) *Attorney, Agent, or Firm*—Schwegman, Lundberg & Woessner P.A.

(57) ABSTRACT

A die package and a method and apparatus for integrating an electro-osmotic pump and a microchannel cooling assembly into a die package.

15 Claims, 13 Drawing Sheets

OTHER PUBLICATIONS

Yao, Shuhuai, et al., "Porous glass electroosmotic pumps: Design and experiments", *Journal of Colloid and Interface Science*, 268(1), (143-153),Dec. 1, 2003.

Yao, Shuhuai, et al., "Porous glass electroosmotic pumps: Theory", *Journal of Colloid and Interface Science*, 268(1), (Dec. 1, 2003),133-142.

Zhang, Lian , "Measurements and modeling of two-phase flow in microchannels with nearly constant heat flux boundary conditions", *Journal of Microelectromechanical Systems*, 11(1), (Feb. 2002),12-19.

* cited by examiner

APPARATUS AND METHOD INTEGRATING AN ELECTRO-OSMOTIC PUMP AND MICROCHANNEL ASSEMBLY INTO A DIE PACKAGE

TECHNICAL FIELD

Various embodiments disclosed herein relate to the field of electronic package fabrication, and more specifically to a method and apparatus integrating an electro-osmotic pump and a microchannel assembly into a die package.

BACKGROUND INFORMATION

Bare electronic chips typically need to be packaged in a package that provides an electric circuit between each electrical connection of the chip and an external connector such as a pin or a ball extending from the package to external circuitry such as a printed circuit board. The circuitry on the chip, particularly a very fast chip such as a microprocessor, generates a considerable amount of heat.

DETAILED DESCRIPTION

Figure 1:
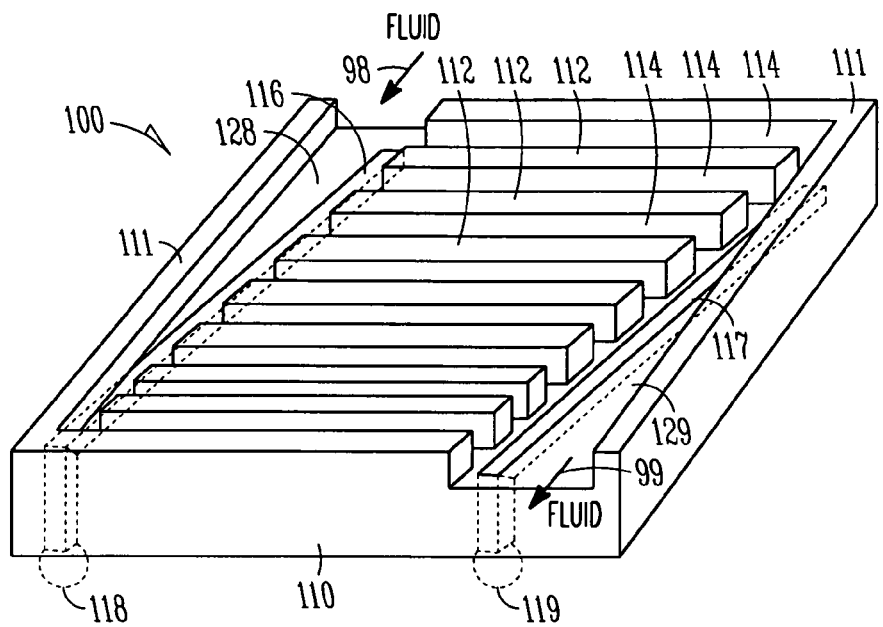
FIG. 1 is a perspective schematic view of a portion of an electro-osmotic pump 100.

In the following detailed description of various embodiments, reference is made to the accompanying drawings that form a part hereof, and in which are shown by way of illustration, some specific embodiments in which the subject matter may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements, at least one of which is a metallic element.

The terms substrate or core generally refer to the physical structure or layer that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting materials, or combinations of semiconducting and non-semiconducting materials. In some embodiments, substrates include layered structures, such as a core sheet or piece of material (such as iron-nickel alloy) chosen for its coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic layer has wiring traces that carry signals and electrical power horizontally, and vias that carry signals and electrical power vertically between layers of traces.

The term vertical is defined to mean substantially perpendicular to the major surface of a substrate. Height or depth refers to a distance in a direction perpendicular to the major surface of a substrate.

FIG. 1 is a perspective schematic view of a portion of an electro-osmotic pump 100 according to some embodiments. Not shown is a cover plate (for example, a planar structure that is attached in contact with the top of edge walls 111 and channel walls 112), and the inlet and outlet pipes, channels, or tubing that provide inlet fluid 98 and receive outlet fluid 99. Substrate 110 has recesses formed in it which form enclosed fluid channels once the cover plate (not shown) is attached. Substrate 110 can be made of plastic, glass, silicon, ceramic, or other suitable material. In some embodiments, substrate 110 is an electronics chip, with the active electronics layer facing down, and the recesses etched in the back of the bulk layer. Inlet plenum 128 receives the inlet fluid (for example, water or other suitable fluid). A plurality of relatively narrow channels 114 connect and allow transport of the fluid between inlet plenum 128 and outlet plenum 129. An electrode 116 is located towards the inlet-plenum end of most or all channels 114 (for example, along the floor or ceiling of inlet plenum 128), and another electrode 117 is located towards the outlet-plenum end of most or all channels 114 (for example, along the floor or ceiling of outlet plenum 129). In some embodiments, the inlet plenum 128 and the outlet plenum are each tapered for space efficiency; since each pump channel draws a little fluid, the inlet plenum 128 can be made narrower towards the next channel, and the outlet plenum is made wider after each pump channel. In some embodiments, a plurality of rows of pump channels and their respective electrodes are plumbed in series to obtain greater flow and/or pressure. In some embodiments, voltage is applied between electrode 116 and electrode 117, and one or more ionized species located in the electrical double layer moves from one electrode to the other, and thus causes a certain amount of fluid flow through channels 114 (the electrical double layer is a region of molecular dimension at the boundary of two substances across which an electrical field exists. The substances typically each contain electrically charged particles, such as electrons, ions, or molecules with a separation of electrical charges, e.g., polar molecules). In some embodiments, the channels have a cross-section that is quite small, for example, on the order of one micron wide by ten microns long. In various embodiments the depth of the channel may be anywhere from one micron to several hundred microns.

Figure 2:
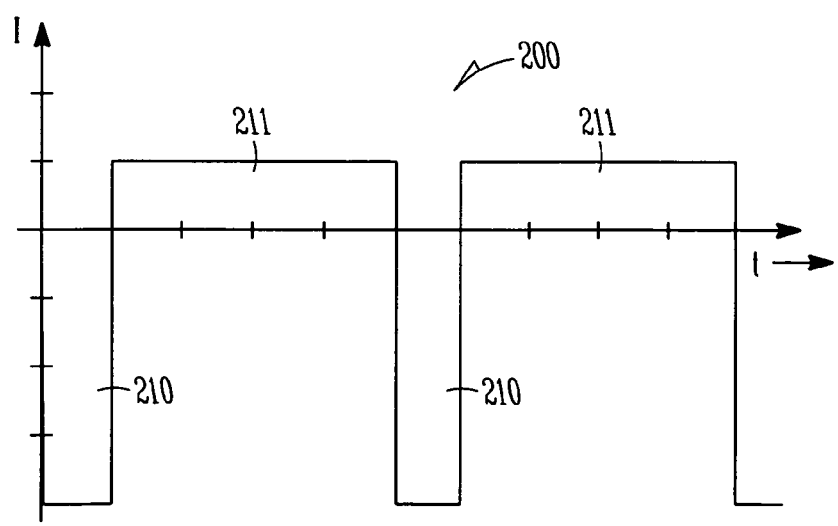
FIG. 2 is a graph 200 of current flow used for one embodiment of EO pump 100.

FIG. 2 is a graph 200 of current flow used for some embodiments of electro-osmotic pump 100. In some embodiments, for example using water as the fluid, a DC current flow will soon cause bubbles of oxygen at one electrode and hydrogen at the other electrode. These bubbles, once formed, can end up blocking the channels 114 and stopping or interfering with the flow of fluid. To prevent this problem, some embodiments use an alternating current, in order to neutralize bubble formation by having a net average of zero current. For example, a longer duration, lower-current positive pulse 211 establishes fluid flow, alternating with a shorter duration, higher-current negative pulse 210 that neutralizes the ionized species to prevent bubble formation. In some embodiments, the relative proportion of the magnitude of positive and negative current is inversely proportional to the duration of the pulses, such that there is a net average zero current flow averaged over a large period of time. In some embodiments, the absolute duration of the positive and negative pulse is varied in an experiment to determine an optimum ratio to obtain good fluid-flow rates and to avoid bubbles that block flow.

In other embodiments, alternate channels are provided to collect the bubbles (for example, hydrogen and oxygen), to remix them and to chemically recombine them (for example, in the presence of a catalyst) to form water.

FIGS. 3A–3J show cross-sections of a chip after various process steps used to form an integrated EO pump and microchannel cooling system for the electronics of the chip. In some embodiments, the integrated EO pump and microchannel cooling system is self contained on the chip package, and is used primarily to even out the heat distribution and eliminate hot-spots of concentrated heat. In other embodiments, external fluid connections are provided, wherein the fluid is plumbed to an external heat sink or heat-dissipation plate to be cooled and then returned to the chip. In some embodiments, a single-phase, all liquid system is used. In other embodiments, a two-phase, liquid-gas system is used, wherein the pump moves liquid coolant from the heat sink to the hot spot, where it undergoes a phase change to a gas, which then moves to the heat sink and is cooled to a liquid again.

Figure 3A:
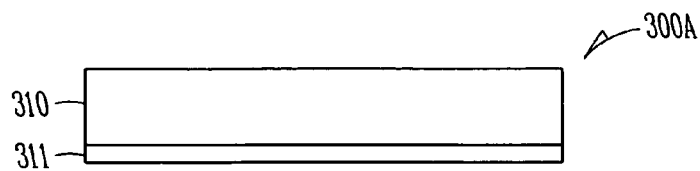
FIG. 3A is a side cross-section schematic view of an electronics chip 300A in process of fabricating an attached electro-osmotic (EO) pump cooling system.

FIG. 3A is a side cross-section schematic view of an embodiment of an electronics chip 300A at one stage in a process of fabricating an attached electro-osmotic (EO) pump cooling system. The bulk portion 310 is shown at the top, and the active region 311 is shown at the bottom. Active region 311 is, in some embodiments, a silicon-on-insulator electronics circuit, supporting functions such as a microprocessor, memory, bridge, controller, and/or communications.

Figure 3B:
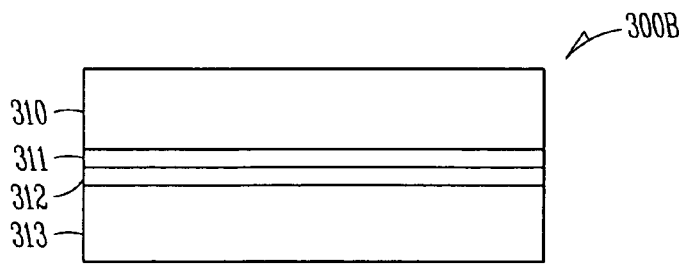
FIG. 3B is a side cross-section schematic view of a chip 300B in process.

FIG. 3B is a side cross-section schematic view of an electronics chip 300B in some embodiments, after a temporary "handle" wafer 313 is attached to the active region 311 face, for example, using a layer of suitable glue 312. In some embodiments, handle wafer 313 is a polished silicon wafer used for its flatness and matched coefficient of thermal expansion (CTE) to the wafer of interest (layers 311 and 310). In other words, after transistor and interconnect fabrication is complete, but before the bumping process commences (for external electrical connections such as solder balls), the front-side of a wafer that contains the active silicon is attached using a glue to a silicon handle wafer.

Figure 3C:
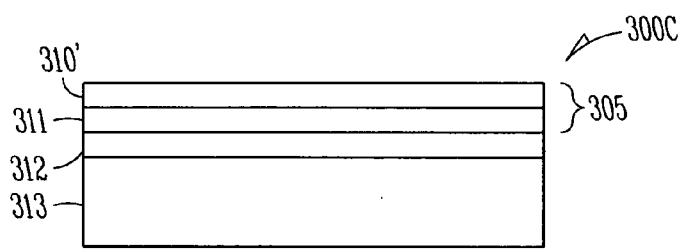
FIG. 3C is a side cross-section schematic view of a chip 300C further in process.

FIG. 3C is a side cross-section schematic view of an electronics chip 300C further in process after a polishing operation. At this point in the process, much of the back of bulk layer 310 has been removed (for example, by chemicalmechanical polishing), thus thinning the chip 305 to a thin bulk layer 310' and an active layer 311. This very thin wafer layer would be too fragile to handle or process alone, which is why handle wafer 313 was attached using glue 312.

Figure 3D:
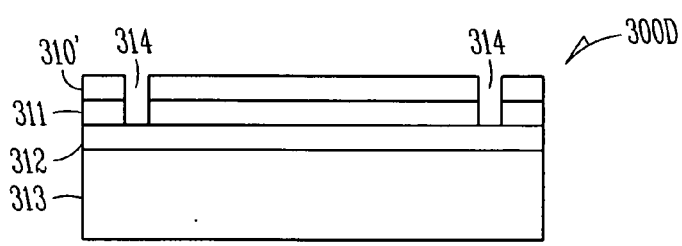
FIG. 3D is a side cross-section schematic view of a chip 300D further in process.

FIG. 3D is a side cross-section schematic view of an electronics chip 300D further in process. At this point in the process, a plurality of holes 314 has been formed (for example, by etching through photolithographically defined openings).

Figure 3E:
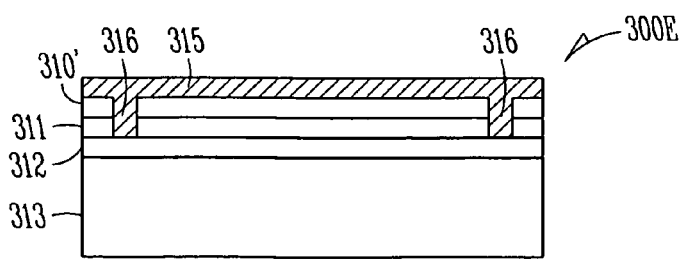
FIG. 3E is a side cross-section schematic view of a chip 300E further in process.

FIG. 3E is a side cross-section schematic view of an electronics chip 300E further in process. At this point in the process, a suitable electrical conductor is deposited to fill or substantially fill vias 314. In some embodiments, a layer 315 of metal (e.g., Cu or Al) is deposited (e.g., using electro-deposition, sputter, or other suitable techniques) in such a way that the vias are filled with the metal 316.

Figure 3F:
FIG. 3F is a side cross-section schematic view of a chip 300F further in process.
Figure 3G:
FIG. 3G is a side cross-section schematic view of a chip 300G further in process.

FIG. 3F is a side cross-section schematic view of an electronics chip 300F further in process, in some embodiments. There are more than one possible variation for this step. In some embodiments, the existing deposited metal 315 (see FIG. 3E) is patterned and etched to form the resulting pump electrodes 317, as shown in FIG. 3G. In some embodiments, this variation is used when the electrode 317 and via layer metal 316 are identical materials. In other embodiments, using polish and/or etch-back techniques, the top metal 315 is removed from the back of the wafer leaving metal 316 only in the vias, as shown in FIG. 3F. A second layer of metal that has different composition than the via metal 316 is deposited, patterned and etched to form the electrodes 317 over the vias, resulting in the configuration of FIG. 3G.

FIG. 3G is a side cross-section schematic view of an electronics chip 300G further in process. At this point in the process, the electrodes 317 have been patterned and etched. In some embodiments, the metal of electrode 317 is the same as the metal of the via 316, while, in other embodiments, a different type or composition of metal is used. In some embodiments, a thin layer of silicon oxide is deposited next, to form a good bond to later structures.

Figure 3H:
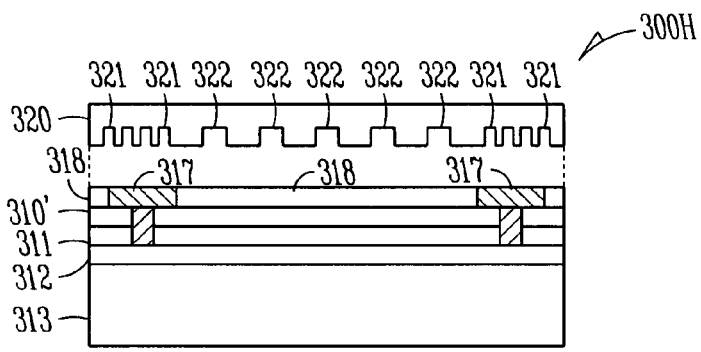
FIG. 3H is a side cross-section schematic view of a chip 300H further in process.

FIG. 3H is a side cross-section schematic view of an electronics chip 300H further in process. At this point in the process, in some embodiments, oxide layer 318 has been deposited to improve the bond to silicon (in some embodiments) channel wafer 320. Wafer 320 has already been processed to form pump channels 321, and cooling microchannels 322. Electrodes 317 provide electrical power for the pumps, which circulate the cooling fluid through the microchannels 322 across the back of the electronics chip (layers 310' and 311), and then through, for example, a heat-dissipating plate or finned heat sink remote from the chip. In other embodiments, the pump channels 321 and/or cooling channels 322 are instead etched into the back of the thinned bulk layer 310', and wafer 320 merely forms an enclosure for the channels, for example, a flat cover plate.

Figure 3I:
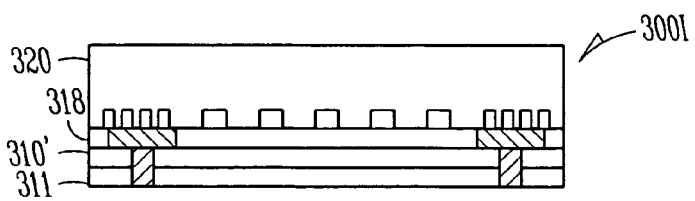
FIG. 3I is a side cross-section schematic view of a chip 300I further in process.

FIG. 3I is a side cross-section schematic view of an electronics chip 300I further in process. At this point in the process, the channel wafer 320 has been attached (by standard wafer-bonding techniques such as anodic bonding, direct bonding or eutectic bonding) to the back face of thinned bulk layer 310', and the handle wafer 313 and glue layer 312 have been removed (for example, by applying heat, etching, and/or solvent). In some embodiments, the wafer is diced before removing the handle layer 313.

Figure 3J:
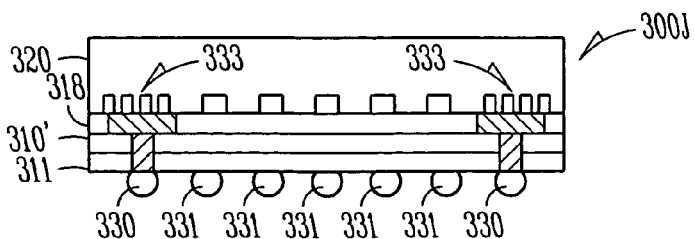
FIG. 3J is a side cross-section schematic view of a chip 300J further in process.

FIG. 3J is a side cross-section schematic view of an electronics chip 300J further in process, for some embodiments. At this point in the process, the chip has been bumped (for example, by adding solder balls 330 that provide connections for electrical power to the EO pumps 333, and solder balls 331 that provide power and signal connections to the electrical circuit of active layer 311. In this way, electrical power for the chip's circuitry in active layer 311 on the front of the chip and for the EO pumps 333 on the back of the chip (relative to the active layer) are all brought in at the exposed face of active layer 311.

Thus, in these embodiments shown in FIGS. 3A–3J, the pump channels and conduits 321, as well as the cooling microchannels or conduits 322 are all formed in a single layer 320 (or in the back of layer 310'). This is particularly useful in situations where there is sufficient lateral area to form sufficient EO pumps to be connected in parallel and/or series, as well as area for the cooling microchannels in order to obtain enough fluid flow and cooling area to provide the desired cooling. The single layer also saves cost, manufacturing time, and complexity, as compared to having these functions in separately made parts or layers. In some embodiments, the pumps and/or the microchannels are not simultaneously integrated on the die with the electronics circuit. In some such embodiments the pumps are made on a different piece of silicon and are assembled either within the same package as the electronics circuit and microchannels, or are connected to, but completely external to, the package having the microchannels.

FIGS. 4A–4K show cross-sections of a chip after various process steps used to form an integrated EO pump and microchannel cooling system for the electronics of the chip. This system provides a different structure for an attached electro-osmotic (EO) pump cooling system than is shown in FIGS. 3A–3J.

Figure 4A:
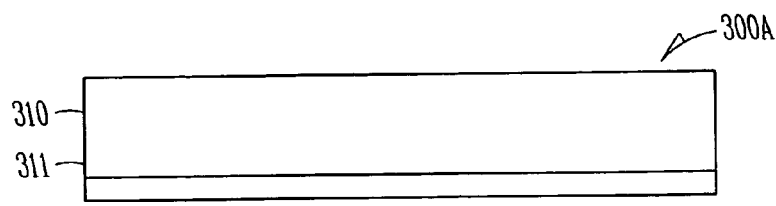
FIG. 4A is a side cross-section schematic view of a chip 300A in process of fabricating a different attached electro-osmotic (EO) pump cooling system than is shown in FIGS. 3A–3J.
Figure 4B:
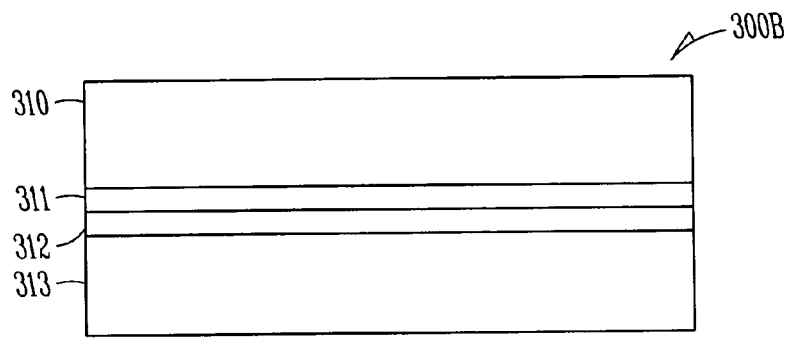
FIG. 4B is a side cross-section schematic view of a chip 300B further in process.
Figure 4C:
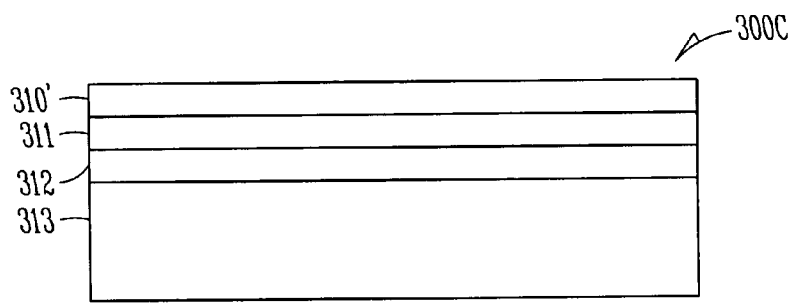
FIG. 4C is a side cross-section schematic view of a chip 300C further in process.

FIG. 4A is a side cross-section schematic view of an electronics chip 300A as described above for FIG. 3A. FIG. 4B is a side cross-section schematic view of an electronics chip 300B as described above for FIG. 3B. FIG. 4C is a side cross-section schematic view of an electronics chip 300C as described above for FIG. 3C.

Figure 4D:
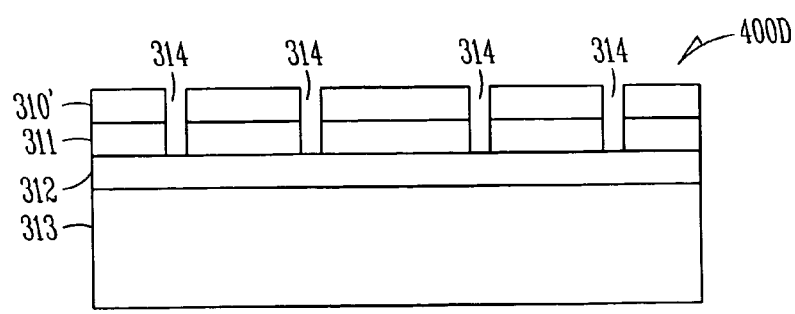
FIG. 4D is a side cross-section schematic view of a chip 400D further in process.

FIG. 4D is a side cross-section schematic view of an electronics chip 400D further in process. As described above for FIG. 3D, a plurality of vias 314 have been formed (e.g., by etching using a photolithographic mask) through the thinned bulk layer 310' and the active layer 311 in order to provide electrical connections from the front of the active layer (i.e., the face adjoining glue layer 312) to the back of the thinned bulk layer where the EO pumps will be formed.

Figure 4E:
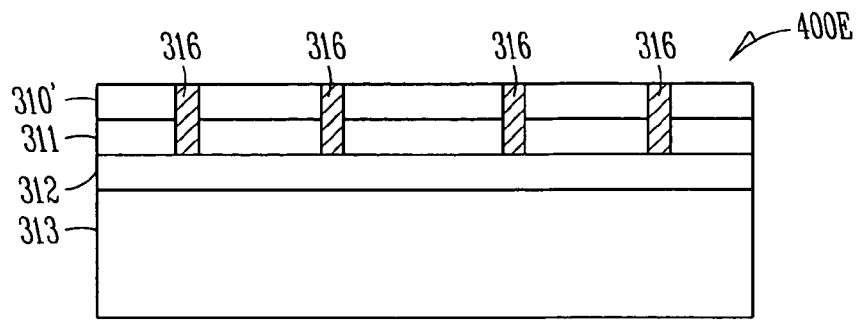
FIG. 4E is a side cross-section schematic view of a chip 400E further in process.

FIG. 4E is a side cross-section schematic view of an electronics chip 400E further in process. At this point in the process, a metal layer has been deposited in order to fill vias 314 with metal conductors 316, and the surface metal (such as layer 315 of FIG. 3E) has been removed, as described above for FIG. 3F.

Figure 4F:
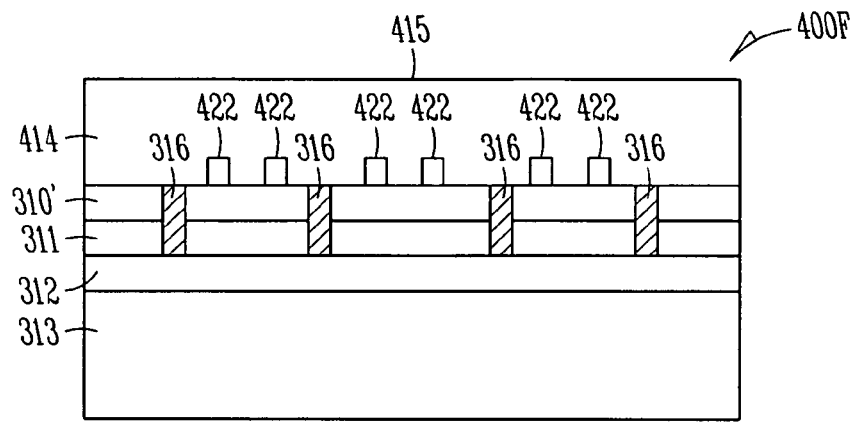
FIG. 4F is a side cross-section schematic view of a chip 400F further in process.

FIG. 4F is a side cross-section schematic view of an electronics chip 400F further in process. A wafer 414 (some embodiments use a silicon wafer 414 to better match CTE of the base silicon wafer (layers 311 and 310'), wafer 414 having a plurality of grooves or microchannels 422 etched in its surface is bonded (e.g., by anodic bonding or other suitable wafer bonding techniques) to the surface of thinned bulk layer 310'. The microchannels 422 provide the paths for circulating cooling fluid (such as water, in some embodiments).

Figure 4G:
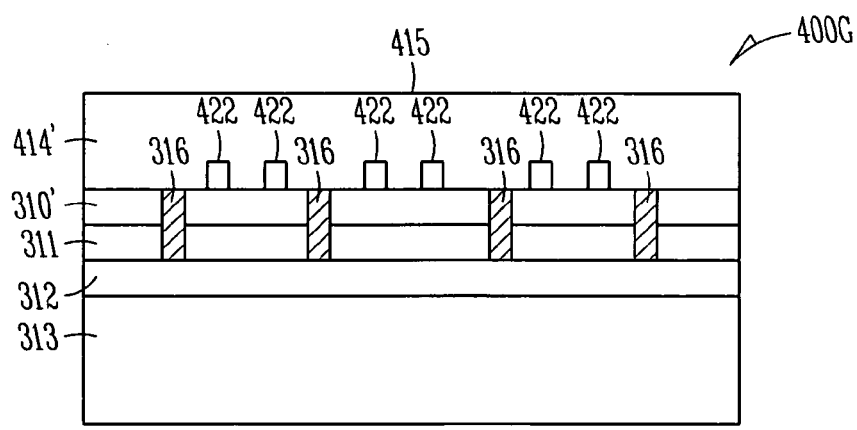
FIG. 4G is a side cross-section schematic view of a chip 400G further in process.

FIG. 4G is a side cross-section schematic view of an electronics chip 400G further in process. At this point in the process, the back of the wafer of microchannel layer 414 has been thinned by a suitable polishing technique as described above, to form thinned microchannel layer 414', with top surface 415.

Figure 4H:
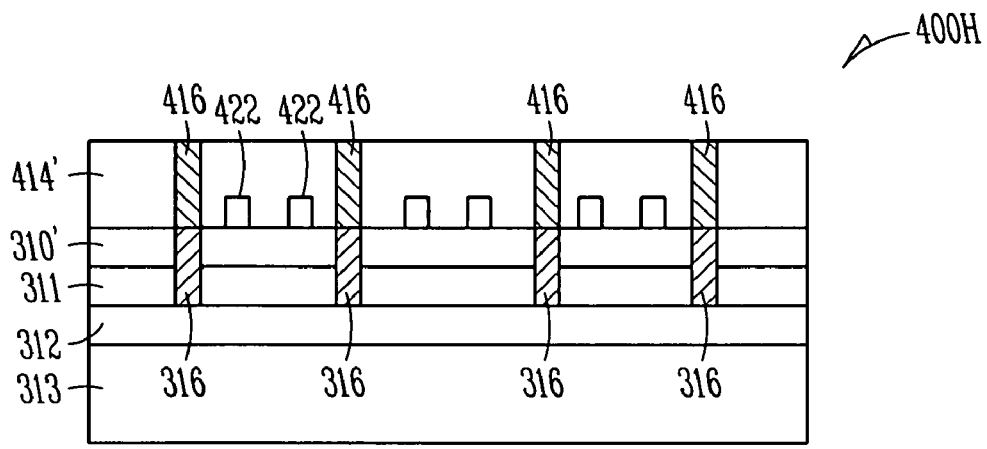
FIG. 4H is a side cross-section schematic view of a chip 400H further in process.

FIG. 4H is a side cross-section schematic view of an electronics chip 400H further in process. At this point in the process, in some embodiments, vias have been etched through thinned microchannel layer 414' to connect to the tops of metal conductors 316, and these vias have been filled with metal to form conductors 416. In some embodiments, the tops of conductors 416 are flush with the exposed face of thinned microchannel layer 414' as shown in FIG. 4H (e.g., where a different metal will be deposited to form the electrodes 417—see FIG. 4I), while in other embodiments, surface metal from the metal deposited to form conductors 416 is left to form the electrodes to drive the EO pumps in the next layer (layer 420, described below).

Figure 4I:
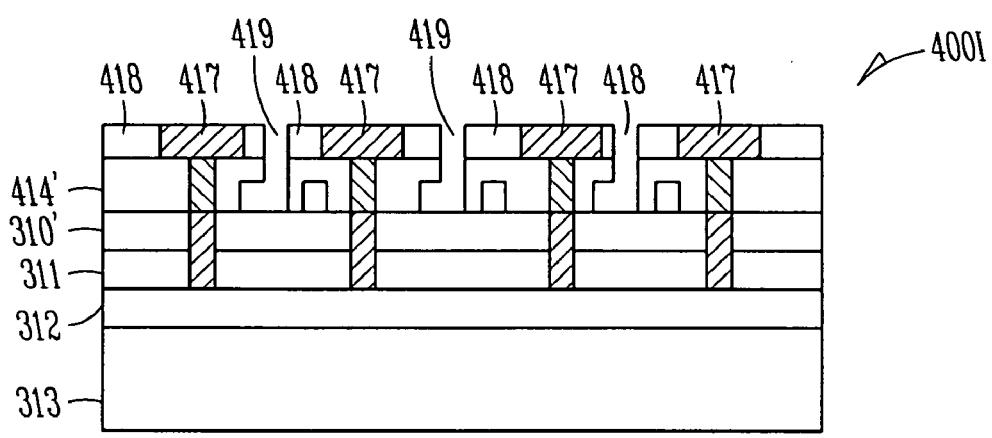
FIG. 4I is a side cross-section schematic view of a chip 400I further in process.

FIG. 4I is a side cross-section schematic view of an electronics chip 400I further in process. At this point in the process, the electrodes 417 have been formed and patterned, and, in some embodiments, a layer of silicon oxide 418 or other suitable bonding interface material has been deposited and planarized. Further, a plurality of through channels 419 have been etched to provide paths to conduct fluid down into the microchannels 422.

Figure 4J:
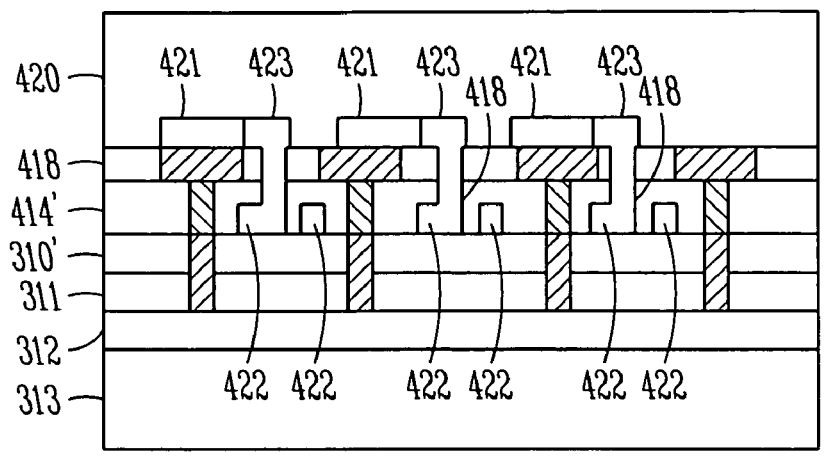
FIG. 4J is a side cross-section schematic view of a chip 400J further in process.

FIG. 4J is a side cross-section schematic view of an electronics chip 400J further in process. At this point in the process, a wafer 420 (some embodiments use a silicon wafer 420 to better match CTE of the underlying wafer layers 414, 311 and 310') having a plurality of EO pump grooves or channels 421 and plenum openings 423 etched in its surface is bonded (e.g., by anodic bonding or other suitable wafer bonding techniques) to the surface of thinned microchannel layer 414'. The grooves 421 and electrodes 417 form EO pumps 333 in the top layer 420 that are in fluid communications with cooling microchannels 422 in the intermediate layer 414'. The plenum channels or openings 423 connect through opening 419 down into the microchannels 422 of thinned layer 414' to provide the paths for circulating cooling fluid (such as water, in some embodiments). Thus, in these embodiments shown in FIGS. 4A–4K, the pump channels and conduits are formed in layer 420, and the cooling microchannels or conduits are formed in a different layer 414'. This is particularly useful in situations where more lateral area is needed to form EO pumps to be connected in parallel and/or series in order to obtain enough fluid flow to provide the desired cooling that is needed.

Figure 4K:
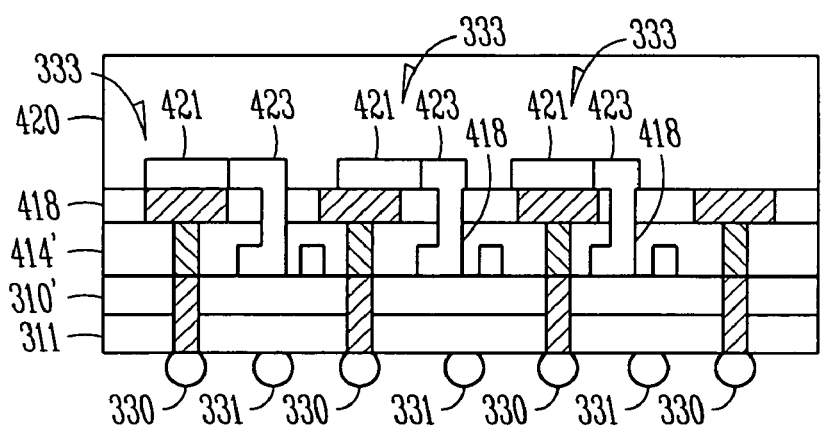
FIG. 4K is a side cross-section schematic view of a chip 400K further in process.

FIG. 4K is a side cross-section schematic view of an electronics chip 400K further in process, wherein solder balls 330 for pump power and solder balls 331 for chip power and signals have been attached.

Figure 5:
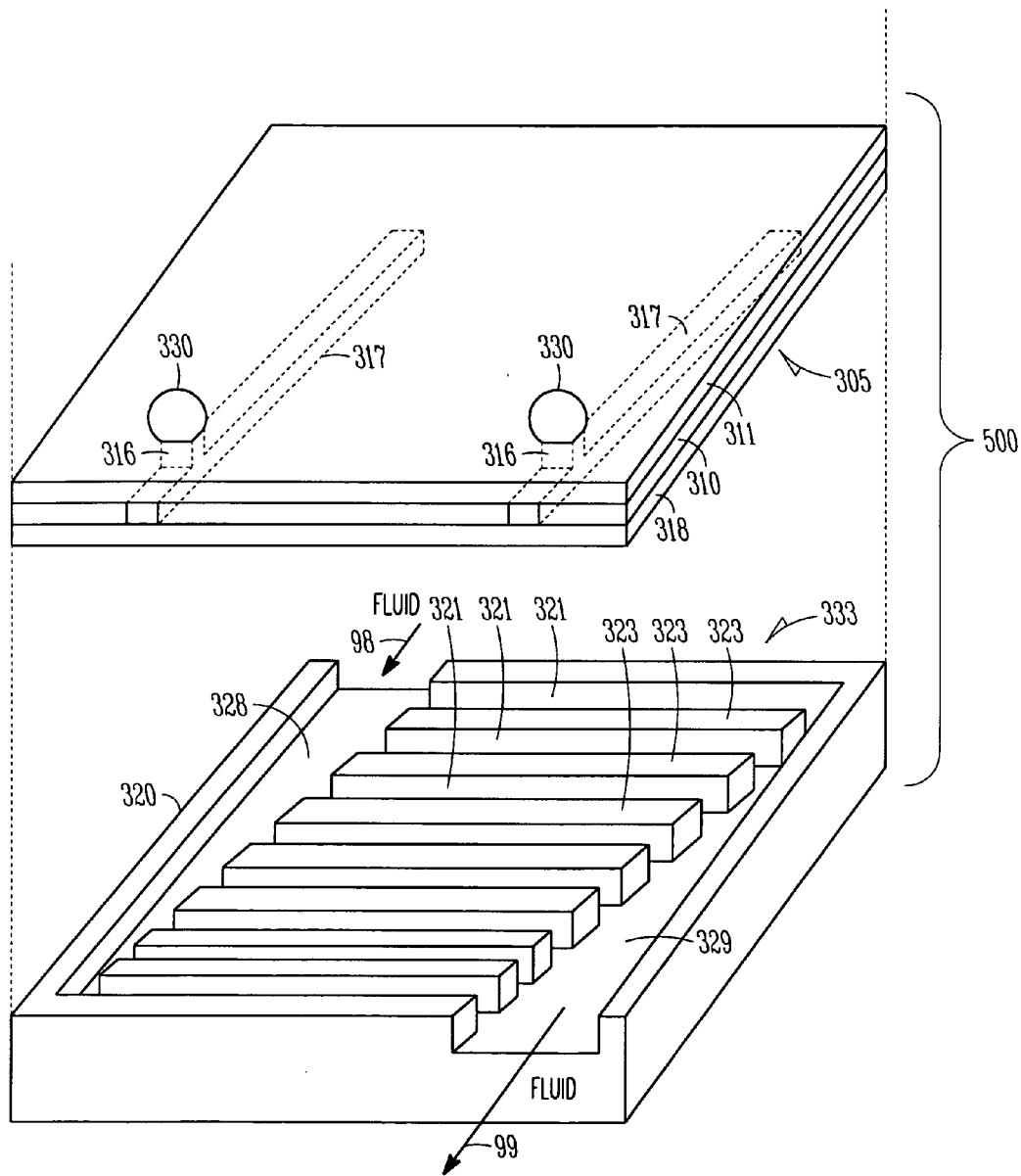
FIG. 5 is an exploded perspective view of an electronics part 500 in process.

FIG. 5 is an exploded perspective view of an electronics part 500, before attachment of the tubing needed for external plumbing. Part 500 is similar to part 300J of FIG. 3J, but wherein inlet plenum 328, pump channels 321, and outlet plenum 329 also function as distributing cooling fluid across the back side of thinned bulk layer 310' and active layer 311. Part 500 is also similar to part 100 of FIG. 1, but wherein the pump electrodes are formed on the cover layer (i.e., thinned chip 305), and the electrical connections 316, 330 are formed through the active layer 311. In some embodiments, part 500 when assembled represents the entire packaged electronics chip 305, just before attaching fluid-connection tubing to the side of inlet port plenum 328, and to the side of outlet port plenum 329. In other embodiments, part 500 represents a small portion of a laterally much larger part having further cooling channels and/or pump portions that are fabricated in the same plane as inlet plenum 328, pump channels 321, and outlet plenum 329, but laterally extending to the desired size.

Figure 6:
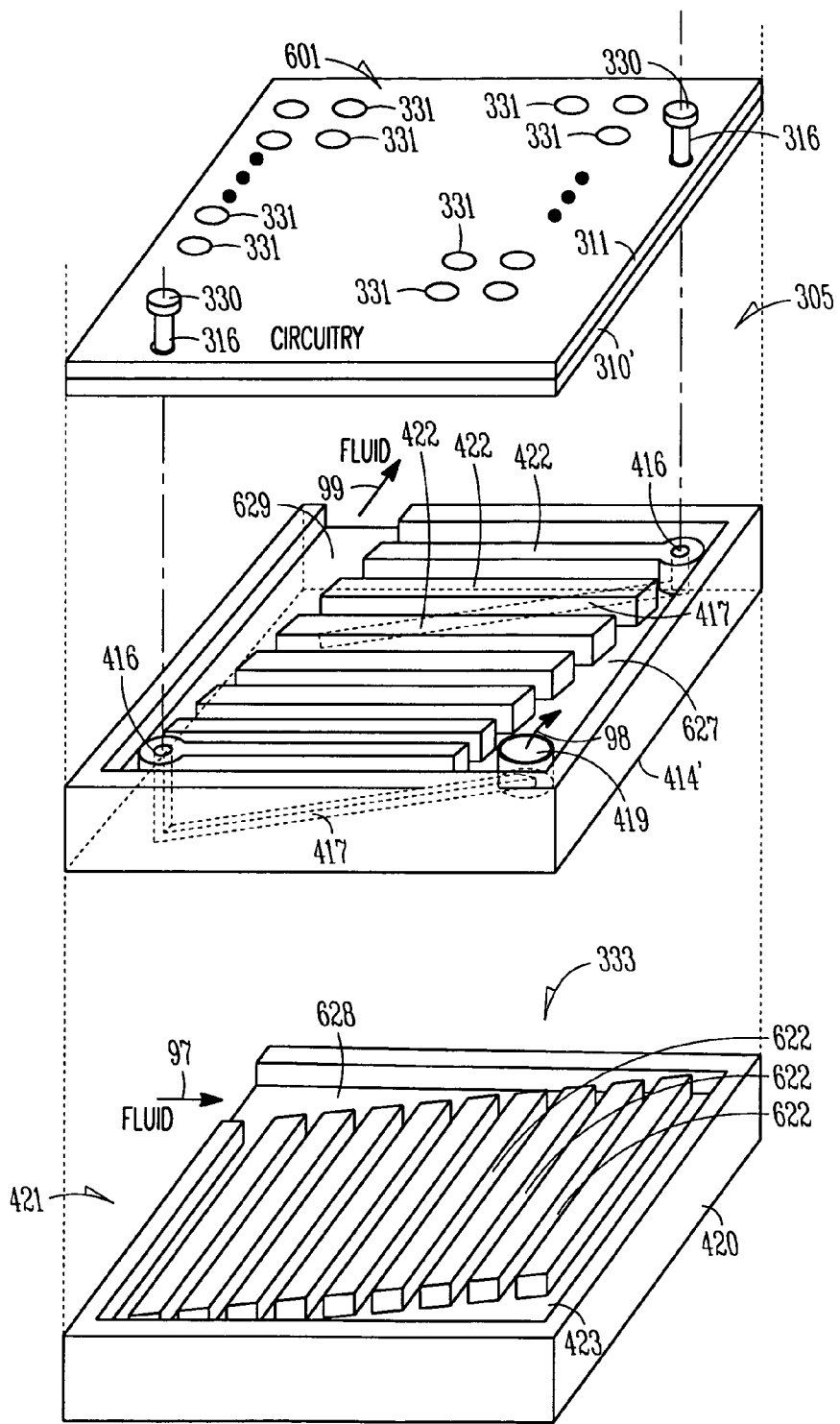
FIG. 6 is an exploded perspective view of an electronics part 600 in process.

FIG. 6 is an exploded perspective view of an electronics chip 600 in process, before attachment of the tubing needed for external plumbing. Part 600 is similar to part 400K of FIG. 4K, but wherein inlet plenum 628 (holding inlet fluid 97) and pump channels 622 (of pump 421) are shown in pump layer 420. Intralayer via 419 conducts fluid 98 from pump outlet plenum 423 to the inlet plenum 627 of cooling layer 414', where the fluid passes through microchannels 422 to outlet plenum 629, thus cooling active layer 311 by conduction through thinned bulk layer 310'. In some embodiments, an oxide bonding layer is provided between layer 420 and layer 414', and/or between layer 414' and 310'. Power to the pump is provided through solder balls 330, and conductors 316 and 416 to electrodes 417 of EO pump 421. Signal and power connections to circuitry 601 are provided by solder balls 331. In some embodiments, part 600 represents the entire electronics chip 315, just before attaching fluid-connection tubing to the side of inlet port plenum 328, and to the side of outlet port plenum 329. In other embodiments, part 500 represents a small portion of a laterally much larger part having further cooling channels and/or pump portions that are fabricated in the same plane as inlet plenum 328, pump channels 321, and outlet plenum 329, but laterally extending to the desired size, as shown in FIG. 3J, for example. The serially connected pumps in the figure are schematically shown for clarity, without attempting to show proportion. When the pumps are too close, there is typically a big power loss. Thus, in some embodiments, EO pumps in series are placed far apart, or on opposite sides of the chip or chip plenum.

Figure 7:
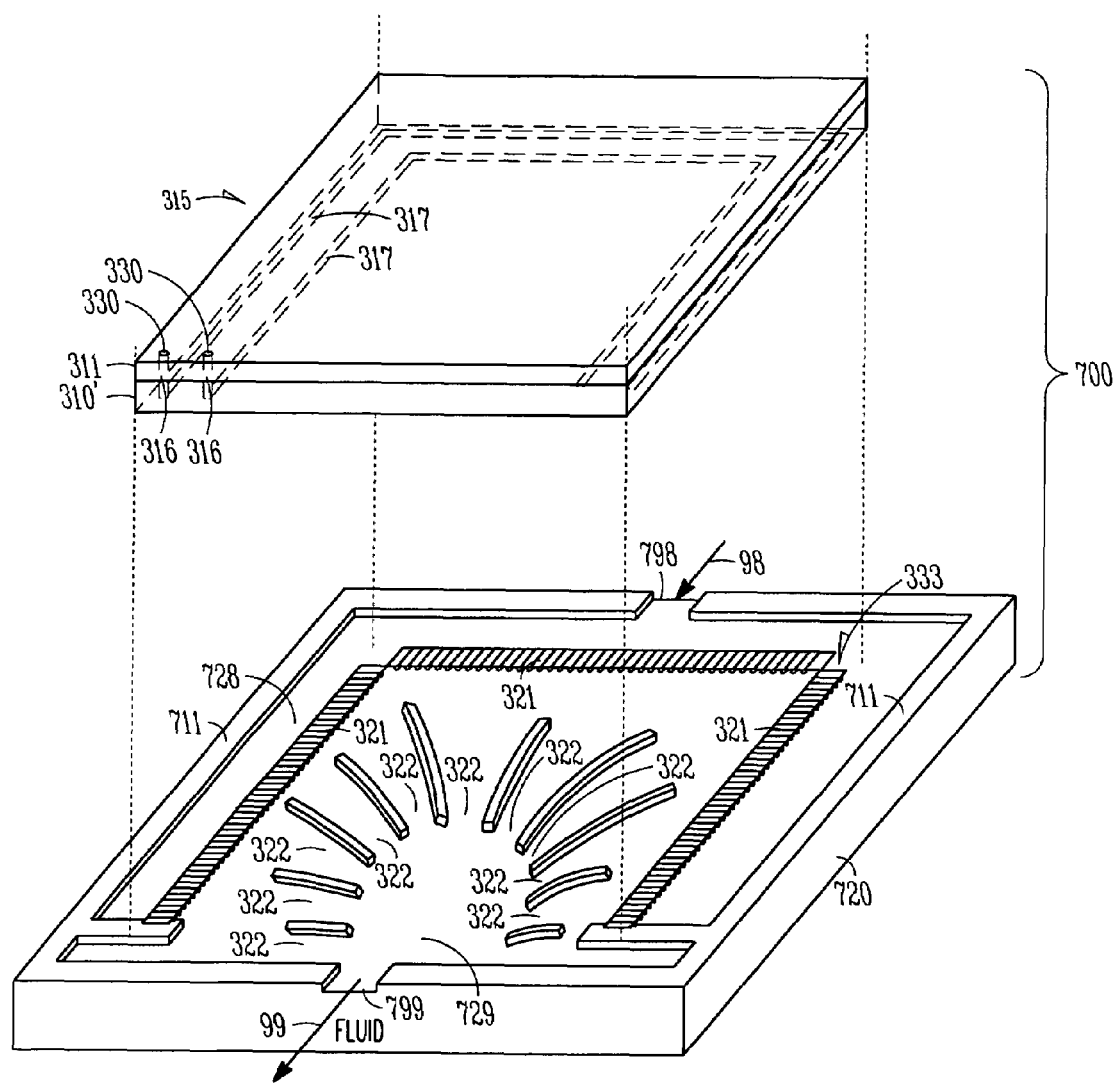
FIG. 7 is an exploded perspective view of an electronics part 700 in process.

FIG. 7 is an exploded perspective view of an electronics chip 700 in process. In this embodiment, an inlet plenum 728 receives inlet fluid 98 and distributes the fluid to pump channels 321. Power to the pump electrodes 317 comes through conductors 316 (formed through active layer 311 and thinned bulk layer 310') and solder balls 330. The outlet fluid then comes to outlet plenum 729 (sometimes a plurality of microchannels 322 (e.g., formed on the inner surface of layer 720, or on the back of chip 315) are also used to control the flow of the fluid across the back of chip 315). In some embodiments, a further row of pump channels (not shown) is placed at the outlet of the microchannels or central reservoir. In some embodiments, two or more rows of pump channels and electrodes are plumbed in series (see FIG. 9) with the pumps placed relatively far apart in place of the single row of pump channels shown. The outlet fluid then exits through the near opening. In some embodiments, suitable tubing for connection to an external heat-dissipation fluid circuit is attached to inlet opening 798 and outlet opening 799. In some embodiments, chip 315 extends to the lateral edges of channel layer 720 to seal against edge walls 711, while in other embodiments, another structure at the outer edges of chip 315 forms the outer-edge seal.

Figure 8:
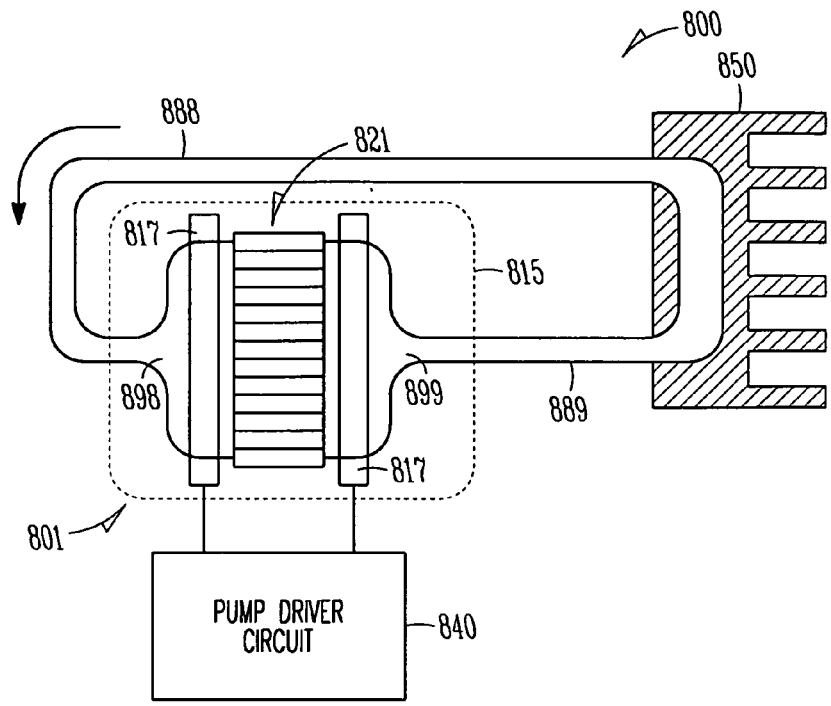
FIG. 8 is a schematic view of an electronics part 800 having an EO pump.

FIG. 8 is a schematic view of an electronics chip 800 having an EO pump 801. Pump driver circuit 840 provides electrical power (e.g., such as shown in FIG. 2, or other suitable power) to electrodes 817, thus drawing fluid through tubing 888, inlet plenum 898, pump channels 821, outlet plenum 899, tubing 889, and heat-dissipation plate or heatsink 850, where the heat of the fluid is transferred to the ambient environment, and the cooled fluid is again circulated, starting at tubing 888. In this embodiment, an electronics chip or circuit 815 is in contact with the fluid in the vicinity of the EO pump 801, which has a plurality of parallel channels.

Figure 9:
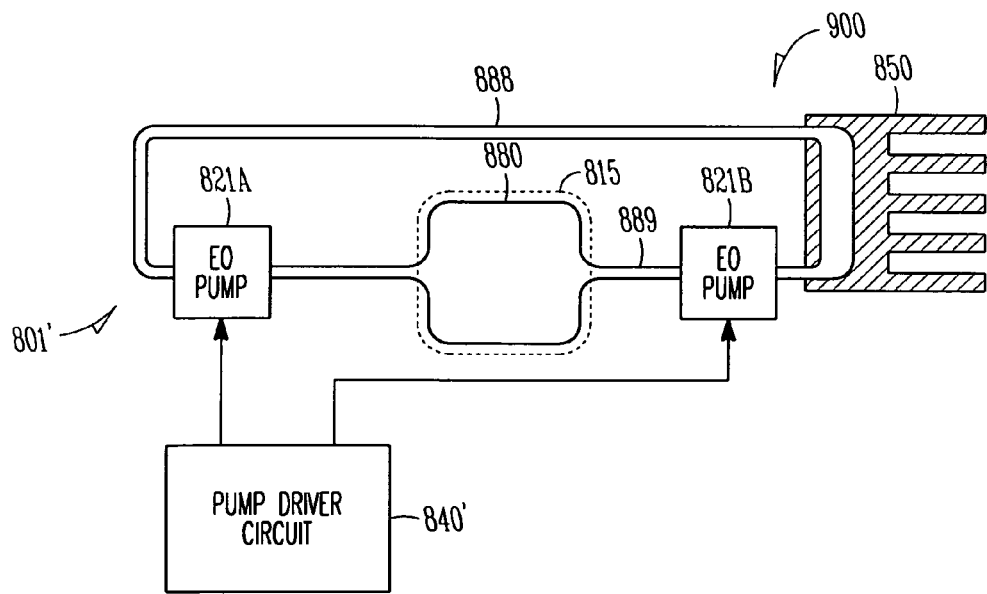
FIG. 9 is a schematic view of an electronics part 900 having an EO pump.

FIG. 9 is a schematic view of an electronics chip 900 having an EO pump that includes pumps 821A and 821B plumbed in series. Pump driver circuit 840' provides electrical power (e.g., such as shown in FIG. 2, or other suitable power) to respective electrodes 817, thus drawing fluid through tubing 888, pump 821A and then through cooling plenum 880 which is against the chip or circuitry 815, then through tubing 889, through pump 821B, and heat-dissipation plate or heatsink 850, where the heat of the fluid is transferred to the ambient environment, and the cooled fluid is again circulated, starting at tubing 888. In this embodiment, an electronics chip or circuit 815 is in contact with the fluid somewhat remote (e.g., an a separate stacked layer, or at a lateral distance) from the EO pump 801, which has a plurality of parallel channels, and two pumps in series to obtain greater flow and/or pressure.

Figure 10:
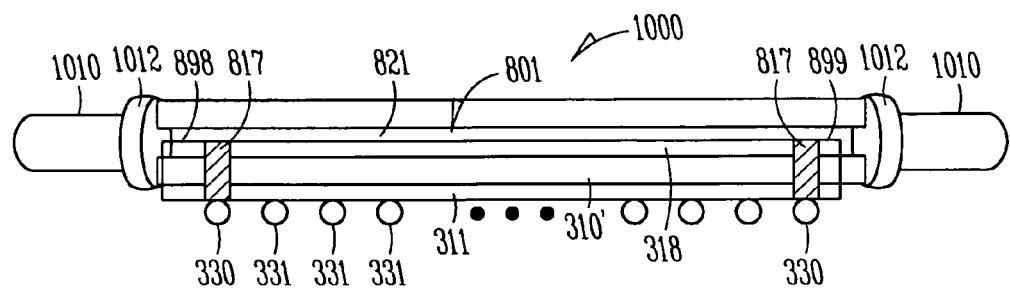
FIG. 10 is a side cross-section schematic view of a chip 1000 having an EO pump.

FIG. 10 is a side cross-section schematic view of an electronics chip 1000 having an EO pump 801. An inlet tubing 1010 and outlet tubing 1010 are attached (e.g., using epoxy 1012). The rest of the reference numerals and corresponding structures are described above.

Figure 11:
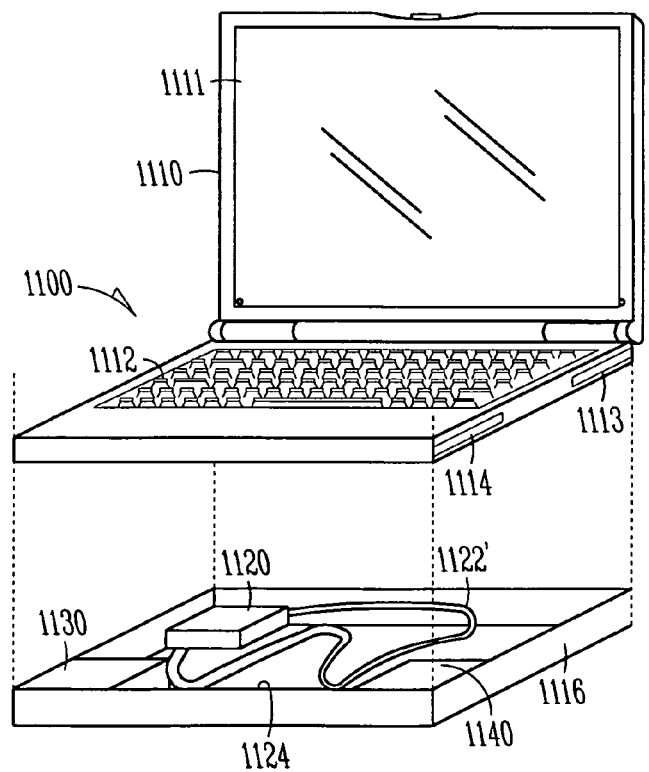
FIG. 11 is a perspective schematic view of a system 1100 having a chip 1120 having an EO pump.

FIG. 11 is a perspective schematic view of an electronics system 1100 of some embodiments (for example, a laptop computer or cell phone or other device) having a chip 1120 having an EO pump. System 1100 optionally includes a top portion 1110 and a bottom portion 1116, a power supply 1130 (such as a battery), an antenna 1140 (such as for a wireless LAN or cellular communications) a display 1111, one or more input/output devices such as a keyboard 1112, a diskette 1113, and/or a DVD/CDROM 1114 or other devices. One or more electronics chips 1120 (each having an EO pump) is connected (for example, by tubing 1122) to a cold plate (e.g., a sheet of copper or aluminum used to dissipate heat and cool the circulating fluid). The one or more electronics chips 1120 can be any of the chip/pump structures described herein, such as, for example, 100 of FIG. 1, 300J of FIG. 3J, 400K of FIG. 4K, 500 of FIG. 5, 600 of FIG. 6, 700 of FIG. 7, or 1200 of FIG. 12.

Figure 12:
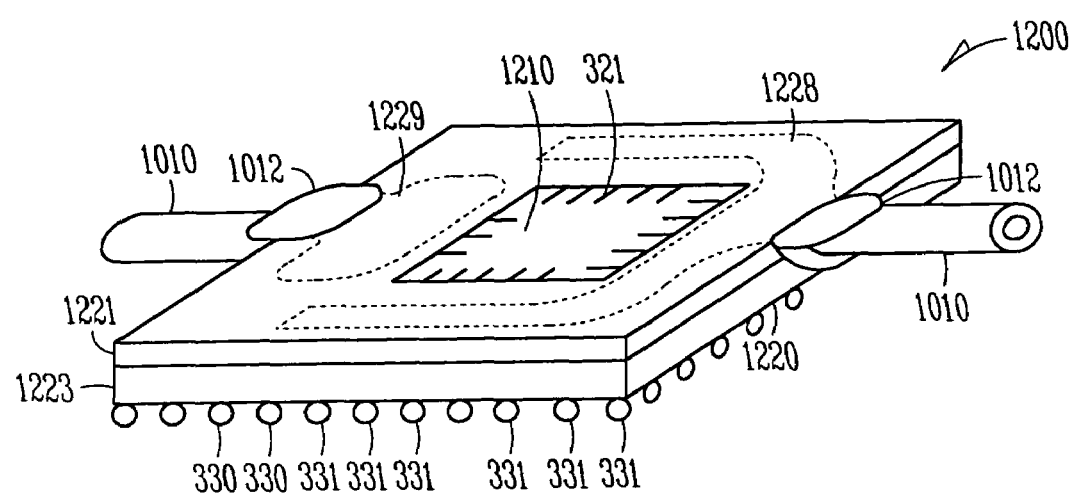
FIG. 12 is a perspective schematic view of a package 1200 having an EO pump.

FIG. 12 is a perspective schematic view of some embodiments, having an electronics package 1200 including an EO pump. In these embodiments, an electronics chip 1210 is enclosed within a case 1220 that includes a top cover 1221 and a bottom cover 1223 (for example, both made from one or more layers of silicon wafers, ceramic, or other suitable material). Solder-ball connections 330 (for the EO pump) and 331 (for the chip 1210) are formed on the external surface of bottom cover 1223. A well within case 1220 holds chip 1210, and also forms the inlet plenum 1228 and outlet plenum 1229. In some embodiments, the well is etched to a suitable depth into the bottom cover. In some embodiments, a plurality of via holes are formed through the bottom cover, and filled with metal such as copper or aluminum to form electrical contacts between inside components, including the EO pump, and the outside environment. A plurality of parallel channels 321, and the appropriate electrodes form the EO pump, for example, as discussed for FIG. 7. Inlet and outlet tubing 1010 are attached to the case using, for example, epoxy 1012, or anodic bonding, direct bonding or eutectic bonding, or other suitable attachment means. Electrical connections are made between solder balls 331 and chip 1210 through the bottom cover by, for example, metal vias as described above.

In some embodiments, prototype micropumps with 0.15 cm$^3$ packages produce a maximum flow rate of 170 µL min$^{-1}$ and a maximum pressure of 10 kPa operating at 400 V. These specifications approach the requirements for single-phase forced-convective cooling of some embodiments of small IC hot spots. In some embodiments, the micropumps operate on less than 200 mW and, having no moving structural elements, offer inherent reliability advantages.

Continued performance improvements for many integrated circuit devices may require new cooling solutions incorporating liquid or two-phase forced convection. Miniature pumps that generate electro-osmotic flow using sintered glass frits have been developed to provide two-phase convective cooling for high-power-density integrated circuits (Yao, S., et al., *Porous Glass Electroosmotic Pumps*. Submitted to Journal of Colloid and Interface Science.). These pumps generate over one atmosphere of pressure at 100 V and can pump liquids at flow rates as high as 33 mL min$^{-1}$.

Electro-osmotic frit pumps produce high pressures and flow rates in high surface-to-volume-ratio structures with sub-micron pores. High-aspect-ratio structures suitable for electro-osmotic pumping can also be made using micromachining techniques (Chen, C.-H. and J. G. Santiago, *A Planar Electroosmotic Micropump*. Journal of Microelectromechanical Systems, 2002. 11(6): p. 672–683.). In the microfabricated pump shown in FIG. 1 (not to scale), narrow slots etched in a silicon substrate form a high surface-to-volume-ratio structure for generating relatively high pressure and flow rate electro-osmotic flow. In some embodiments, a layer of silicon nitride coats the silicon substrate, providing reliable insulation for operation at up to approximately 500 V. In some embodiments, micropumps based on this design produced flow rates on the order of 10 µL min$^{-1}$ and pressures on the order of 10 kPa (Laser, D. J., et al. *High-Frequency Actuation with Silicon Electroosmotic Micropumps*. 2002 Solid State Sensors and Actuators and Microsystems Workshop, 2002, Hilton Head, S.C.).

Since these micropumps have no moving structural elements and are fabricated in a CMOS-compatible process, they are suitable for some IC thermal management applications. One such application is reducing the temperature of small, high-power-density regions of microchips through single-phase forced-convective cooling. Systems-on-a-chip (SoC) and high-performance ICs that contain a mix of high- and low-power devices are prone to developing hot spots during operation. Even with chip-scale heat sinking adequate for the chip's overall power dissipation, the thermal resistance associated with solid-state conduction to the heat sink may be too great to avoid excessive hot-spot temperatures. This is particularly true for chips with multiple active layers in a 3-D configuration [Banerjee, K., et al., *3-D ICs: A Novel Chip Design for Improving Deep-Submicrometer Interconnect Performance and Systems-on-Chip Integration*. Proceedings of the IEEE, 2001. 89(5): p. 602–633.]. A single-phase forced-convection cooling system like the one illustrated in FIG. 3J or 4K is a possible solution. The system incorporates an integrated electro-osmotic micropump, avoiding the need for fluidic connections to the chip. Similar systems incorporating arrays of feedback-controlled silicon electro-osmotic micropumps could provide on-demand forced convective cooling of spatially- and temporally-varying hot spots.

Zhang et al. showed that a flow rate of 100 µL min$^{-1}$ is sufficient for cooling some hot spots [Zhang, L., et al., *Measurements and modeling of two-phase flow in microchannels with nearly constant heat flux boundary conditions*. Journal of Microelectromechanical Systems, 2002. 11(1): p. 12–19.]. To estimate the micropump performance requirements for hot spot cooling generally, one can use a simple model of a single-phase microchannel heat sink [Murakami, Y. and B. B. Mikic, *Parametric Optimization of Multichanneled Heat Sinks for VLSI Cooling*. IEEE Transactions on Components and Packaging Technologies, 2001. 24(1): p. 2–9.]. This model assumes a very small thermal resistance in the solid (Biot number much less than one). It is estimated that the calculated flow rate required for single-phase forced-convective cooling of a 1 mm×1 mm hot spot with a local microchannel heat sink designed to minimize required pumping power is about 0.31 mL/min/W. The corresponding pressure drop (across microchannel heat sink) is about 0.07 kPa/W. These estimates were made using the properties of water at 30° C. and a channel-to-chip cross-sectional area ratio of 0.25. From this analysis, one can conclude that, for an allowed fluid temperature rise of 70° C., forced convective cooling of a 2 W hot spot requires a flow rate of approximately 620 µL min$^{-1}$. The corresponding pressure drop across the microchannel heat sink is approximately 0.14 kPa. Pressure losses in the rest of the system are estimated at 1–10 kPa. Silicon electro-osmotic micropumps for hot spot cooling, therefore, must generate flow rates between one and two orders of magnitude greater than early prototypes while maintaining pressure performance.

The design variables for electro-osmotic micropumps include pump geometry, surface treatment, and the chemistry of the working electrolyte. For an electro-osmotic pump with deep, narrow slot-shaped features (i.e., a slot geometry with slot height b>>2a (=total slot width) and pump slot length l>>2a) and uniform and constant surface and fluid properties, the flow rate Q that results from applying a uniform axial electrical field $E_x$ is [Hunter, R. J., *Zeta Potential in Colloid Science*. 1981, San Diego: Academic Press, Inc.; Burgreen, D. and F. R. Nakache, *Electrokinetic Flow in Ultrafine Capillary Slits*. J. Phys. Chemistry, 1964. 68(5): p. 1084–1091.]:

$$Q = A\{-\mu_{eo}E_x[1-G(a/\lambda_D)]-\phi_1 p_1\} \quad (1)$$

where $p_1$ is the pressure increase in the pump and A is the total flow cross-sectional area (A=2abn, where 2a and b are the slot width and height, respectively, cross-sectional dimensions defined above, and n is the number of slots). The electro-osmotic mobility $\mu_{eo}$ and the parameter $\phi_1$ are $$\mu_{eo} = \frac{\varepsilon \zeta}{\mu} \text{ and } \phi_i = \frac{a^2}{3\,\mu l}$$

where $\mu$ and $\varepsilon$ are the viscosity and permittivity, respectively, of the fluid and $\zeta$ is the zeta potential, defined as the potential drop across the diffuse ion region of the electrical double layer. The function G ranges from 0 to 1, depending on the ratio of the slot half-width, a, and the Debye length, $\lambda_D$, which is the characteristic thickness of the electric double layer in the region of the liquid/solid interface. In some embodiments, micropumps are operated with weak buffer solutions for which $\lambda_D$ is of order 100 nm or smaller. These micropumps have slot half-height a≧1 µm, so finite double layer effects are negligible and G<<1. Therefore, flow rate is expected to scale linearly with A and l$^{-1}$ for a given voltage applied across the pumping region.

Viscous losses in the manifolds of silicon electro-osmotic micropumps can be significant. Approximating flow in the manifolds of our design with a parallel-plate flow model, the pressure increase from the inlet to the outlet of the pump $p_2$ is $$p_2 = -\frac{\mu_{eo}}{\phi_1}E_x\left[1-G\left(\frac{a}{\lambda_D}\right)\right]-\left(\frac{1}{A\phi_1}+\frac{1}{\phi_2}\right)Q$$

where the parameter $\phi_2$ accounts for pressure drops in the manifolds in terms of the effective manifold cross-sectional dimensions $a_m$ and $b_m$ and its length $l_m$:

$$\phi_2 = \frac{2}{3}\frac{a_m^3 b_m}{\mu l_m}.$$

Electro-osmotic micropumps have been fabricated on 4" silicon wafers in a two-mask process. The slots and manifolds are defined in 7 µm thick photoresist (SPR-220-7) and etched by deep reactive ion enhanced etching. Inlet and outlet ports are then etched from the back side of the wafer. After etching, a layer of near-stoichiometric silicon nitride is deposited at low pressure. A glass cover is then anodically bonded to the nitride-coated wafer to seal the slots and manifolds. The wafer is then diced into individual pumps, platinum wires are inserted into the manifolds through channels running to the sides of the dies, and 0.5 cm long glass tubes are epoxied on to the dies to serve as interconnects. In some embodiments, thin-film platinum electrode processes are used for electroosmotic pumps.

In some embodiments, the micropumps each have 500 slots spaced at 20 µm intervals, forming a pumping region 1 cm wide. The volume occupied by the pumping regions is less than 1 mm$^3$. In some embodiments, for ease of fixturing (e.g., attaching fluidic interconnects), the micropumps are fabricated on 1.2 cm×1.3 cm dies. In some embodiments, the silicon nitride passivation layer is 400 µm thick. Slot depth b is approximately 70 µm. In various embodiments, micropumps have slot lengths l of 100 µm, 200 µm, or 400 µm, or other suitable lengths. In some embodiments, micropumps are fabricated with an oxide coating on top of the nitride layer. The oxide coating is applied in the high-aspect-ratio slots by performing a short LPCVD polysilicon deposition followed by wet oxidation of the polysilicon layer in its entirety. The slot height 2a of oxide-coated micropumps is approximately 2.8 µm; the slot height of the nitride-only micropumps is approximately 2.2 µm, in some embodiments.

In some embodiments, the silicon electro-osmotic micropumps are used with borate buffer solutions ($Na_2B_4O_7$, pH=9.2) with concentrations (based on Na$^+$) of 0.2 mM and 0.4 mM. The measured conductivities of these solutions were 15 µS cm$^{-1}$ and 28 µS cm$^{-1}$, respectively. In some embodiments, the micropumps are used at operating voltages of 200 V and 400 V. In one test, only one of the 22 micropumps tested under these conditions failed due to breakdown of the passivation layer and resultant short-circuiting through the silicon substrate. Flow rate under minimal back pressure conditions was measured by tracking the position of the flow front in an open capillary. Pressure vs. flow rate measurements were performed by measuring compression of a gas column in a closed capillary. The margin of error associated with the open-capillary flow rate measurement technique is approximately 5%; the margin of error for the closed-capillary pressure-flow rate measurement technique is approximately 15%. Current was monitored during tests by observing the voltage drop across a small reference resistor in series with the micropump. The margin of error associated with this measurement technique is approximately 15%. Some variation in micropump performance was observed from day to day and over the course of repeated testing during a particular day. The data reported here is from micropumps that had been allowed to stand for at least three days between tests.

Pressure-flow rate results were repeatable within +/−30% for multiple tests of the same micropump and for tests of different micropumps with the same geometry and surface. Measured power consumption was approximately 150 mW at 400 V and 40 mW at 200 V. Thermodynamic efficiency is approximately 0.05%. Zeta potential, estimated from the maximum generated pressures using (1) above, was found to be between −20 and −25 mV.

Micropumps with 100 μm, 200 μm, and 400 μm long pumping regions (in the flow direction) were tested under minimal-back-pressure conditions at 200 V with 0.2 mM and 0.4 mM buffers. The electric field in the pumping region was estimated with a one-dimensional model to account for potential drops in the manifolds. As expected, flow rate per unit applied field is generally independent of pump length. No dependence of performance on buffer concentration was discernable for the two buffer concentrations used. Micropumps with oxide-coated pumping surfaces consistently produced higher $Q_{max}$ than those with bare nitride pumping surfaces.

Current flow is expected to result from electromigration in the micropumps during operation. The electromigration current is predicted from the micropump geometry and the measured bulk buffer conductivity.

Relative to their size, the flow rate produced by the silicon electro-osmotic micropumps exceeds that of many reciprocating displacement micropumps that require more complex fabrication processes. Pressure generation is comparable to that of many reciprocating displacement micropumps. Measured micropump performance was generally consistent with models for electro-osmotic flow. Some variation in micropump performance for low buffer concentration experiments may be due to unstable pH conditions. Also, at very low concentrations, ionic impurities from surfaces and gases in contact with the buffer (e.g., carbonic acid resulting from $CO_2$-water reactions) can have a significant impact on buffer conductivity. At times, measurements of buffers conductivity several hours or days after preparation revealed significant deviation (+/−25%) from the nominal values. This was particularly the case for the 0.2 mM buffer. The micropumps were also tested with buffers at concentrations below 0.2 mM, but conductivity (and performance) variations with these buffers were so great that the tests were discontinued. Operating at concentrations below 0.2 mM, while desirable from the standpoint of maximizing micropump efficiency, is impractical. Operating at 200 V with 0.2 mM and 0.4 mM buffers, the micropumps consume less than 50 mW.

Silicon electro-osmotic micropumps for integrated circuit thermal management applications have been fabricated and tested. Reducing the length of the pumping region and coating the pumping surfaces with silicon oxide has been shown to significantly improve micropump performance. Micropumps with 100 μm long pumping regions and oxide-coated pumping surfaces produce a maximum flow rate and pressure of 170 μL min$^{-1}$ and 10 kPa, respectively, at 400 V. This flow rate is more than an order of magnitude higher than that produced by earlier prototypes.

In some embodiments, the cooling channels and the pump channels are formed in a layer of silicon, in order to better match the CTE of the silicon electronics layer. In other embodiments, the cooling channels and the pump channels are formed in a layer of glass, plastic, ceramic, or other suitable material.

In some embodiments, the package assembly is designed so that the fluid inlet and outlet ports occur from the edges of the silicon (or glass, etc.) package, rather than from the top or bottom face of the package. This can provide simplified internal and external plumbing. In some embodiments, reservoirs formed in the package that contain the coolant fluid are arranged such that they connect together forming a fluid path that is substantially in a single plane (used, for example, to reduce cost), or in a stack of parallel planes (used, for example to increase fluid flow) parallel to the electronics chip. Forming both the pump channels and the cooling channels in a single layer of silicon reduces thermal mismatch, cost and complexity. Sealing of the pump assembly into the package helps ensure that coolant fluid does not leak between the inlet and outlet ports, or around electrical connections between the electronics chip and the pump electrodes. Thinning the electronics chip allows easier fabrication of the vias that provide electrical connections between the front of the electronics chip (where all the other electrical connections are made) and the back of that chip where the pump electrodes are located. Thinning also provides a lower resistance to heat flow between the active electronics layer and the cooling fluid channels and reservoirs.

Some embodiments relate to an apparatus having an electronics chip 315 having a substrate with a first face thereof having circuitry thereon, and an opposite second face, and one or more electro-osmotic pumps 333 in a layer over the second face.

In some embodiments, the electro-osmotic pumps include capillary pump channels in a further layer over the second face of the electronics chip, as described for FIGS. 3A–3J.

In some embodiments, cooling channels are also formed in a further layer over the second face of the electronics chip in fluid communication with the electro-osmotic pumps.

In some embodiments, external fluid connections to the pumps are made at lateral edges of the apparatus 1000, as described in FIG. 10.

In some embodiments, electrical power for the electro-osmotic pumps is conducted by electrical conductors formed through the electronics chip.

In some embodiments, cooling channels are formed in a further layer of material over the second face of the electronics chip, and the electro-osmotic pumps are in fluid communication with the cooling channels, as described for FIGS. 4A–4K.

In some embodiments, electrical power for the electro-osmotic pumps is conducted by electrical conductors formed through the electronics chip to the pumps. In some embodiments, the cooling channels are formed in the same layer as the capillary pump channels. In some embodiments, the chip is silicon, and the electro-osmotic pumps are formed in a further layer of silicon over the second face of the silicon chip in fluid communication with the cooling channels. In some embodiments, external fluid connections are made at lateral edges of the electronics chip.

In some embodiments, electrical power for the electro-osmotic pumps is conducted by electrical conductors formed through the electronics chip. In some embodiments, the chip is made of silicon, and the electro-osmotic pumps include capillary pump channels formed in the layer of silicon over the second face of the chip.

In some embodiments, the chip includes circuitry for at least a portion of a processor, and the apparatus further includes a memory operatively coupled to the processor, an input/output system, including a display unit, operatively coupled to the processor, and a power supply operatively coupled to the processor.

In some embodiments, the chip includes circuitry for at least a portion of a telecommunications circuit, and the apparatus further includes an antenna operatively coupled to the telecommunications circuit, an input/output system, including a display unit, operatively coupled to the telecommunications circuit, and a power supply operatively coupled to the telecommunications circuit.

Other embodiments include a method for cooling an electronics chip having a substrate with a first face having circuitry thereon, and an opposite second face. The method includes pumping a cooling fluid thermally coupled to the second face with one or more electro-osmotic pumps positioned over the second face.

In some embodiments of the method, the electro-osmotic pumps include capillary channels in a layer of material over the second face of the electronics chip, and wherein the pumping includes electroosmotically flowing the cooling fluid in the capillary channels.

Some embodiments of the method further include flowing the cooling fluid through external fluid connections at lateral edges of the electronics chip and the layer containing the electro-osmotic pumps.

Some embodiments of the method further include conducting electrical power for the electro-osmotic pumps by electrical conductors passing through the electronics chip.

Other embodiments include a method that includes providing an electronics chip having a substrate with a first face having circuitry thereon, and an opposite second face, and providing at least one layer of material over the second face, one of the at least one layers forming at least one electro-osmotic pump.

Some embodiments of this method further include forming cooling channels in one of the at least one layers of material over the second face of the electronics chip, the channels operatively coupled to one of the at least one electro-osmotic pumps.

Some embodiments of this method further include attaching a handle layer to the first face of the electronics chip, and thinning the electronics chip by polishing and/or etching the second face of the electronics chip.

Some embodiments of this method further include forming electrical conductors through the electronics chip, for supplying electrical power for the electro-osmotic pumps.

In some embodiments, the chip is made of silicon, and the layer of silicon over the second face of the circuit die is attached to the silicon chip.

Some embodiments of this method further include packaging the electronics chip into a package, mounting the package onto a circuit board having other circuitry, and coupling the packaged electronics chip to supply of fluid to the electro-osmotic pump.

Other embodiments include an apparatus that includes an electronics chip, and electro-osmotic pump for circulating cooling fluid through cooling channels adjacent a face of the chip. In some embodiments, the electro-osmotic pump and the cooling channel are in separate layers of material attached to the face of the chip. In some embodiments the electro-osmotic pump and the cooling channel are in the same layer of material. In some embodiments the electro-osmotic pumping means and the cooling channel are in substantially the same plane.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus comprising:
   an electronics chip having a substrate with a first face thereof having circuitry thereon, and an opposite second face;
   one or more electro-osmotic pumps in a layer over the second face and wherein the electro-osmotic pumps include capillary pump channels in a further layer over the second face of the electronics chip and wherein electrical power for the electro-osmotic pumps is conducted by electrical conductors formed through the electronics chip.

2. The apparatus of claim 1, wherein cooling channels are formed in a further layer over the second face of the electronics chip in fluid communication with the electro-osmotic pumps.

3. The apparatus of claim 1, wherein external fluid connections to the pumps are made at lateral edges of the apparatus.

4. The apparatus of claim 1, wherein cooling channels are formed in a further layer of material over the second face of the electronics chip, and the electro-osmotic pumps are in fluid communication with the cooling channels.

5. The apparatus of claim 4, wherein external fluid connections to the pumps are made at lateral edges of the apparatus.

6. An apparatus comprising:
an electronics chip having a substrate with a first face thereof having circuitry thereon, and an opposite second face; and
one or more electro-osmotic pumps in a layer over the second face.
wherein the electro-osmotic pumps include capillary pump channels in a further layer over the second face of the electronics chip and wherein electrical power for the electro-osmotic pumps is conducted by electrical conductors through the electronics chip to the pumps.

7. An apparatus comprising:
an electronics chip having a substrate with a first face thereof having circuitry thereon, and an opposite second face;
one or more electro-osmotic pumps in a layer over the second face; and cooling channels formed in the same layer as capillary pump channels and wherein electrical power for the electro-osmotic pumps is conducted by electrical conductors formed through the electronics chip.

8. An apparatus comprising:
an electronics chip having a substrate with a first face thereof having circuitry thereon, and an opposite second face; and
one or more electro-osmotic pumps in a layer over the second face and wherein the electronics chip is silicon, cooling channels are formed in a layer of silicon over the second face of the electronics chip, and the electro-osmotic pumps are formed in a further layer of silicon over the second face of the silicon chip in fluid communication with the cooling channels wherein electrical power for the electro-osmotic pumps is conducted by electrical conductors formed through the electronics chip.

9. The apparatus of claim 8, wherein external fluid connections are made at lateral edges of the apparatus.

10. An apparatus comprising:
an electronics chip made of silicon having a substrate with a first face thereof having circuitry thereon, and an opposite second face; and
one or more electro-osmotic pumps in a layer over the second face, and the electro-osmotic pumps include capillary pump channels formed in a layer of silicon over the second face of the chip and wherein electrical power for the electro-osmotic pumps is conducted by electrical conductors formed through the electronics chip.

11. An apparatus comprising:
an electronics chip having a substrate with a first face thereof having circuitry thereon, and an opposite second face and wherein the chip includes circuitry for at least a portion of a processor;
one or more electro-osmotic pumps in a layer over the second face,
a memory operatively coupled to the processor;
an input/output system, including a display unit, operatively coupled to the processor; and
a power supply operatively coupled to the processor.

12. An apparatus comprising:
an electronics chip having a substrate with a first face thereof having circuitry thereon, and an opposite second face and wherein the chip includes circuitry for at least a portion of a telecommunications circuit
one or more electro-osmotic pumps in a layer over the second face;
an antenna operatively coupled to the telecommunications circuit;
an input/output system, including a display unit, operatively coupled to the telecommunications circuit; and
a power supply operatively coupled to the telecommunications circuit.

13. An apparatus comprising:
an electronics chip; and
an electro-osmotic pump for circulating cooling fluid through cooling channels adjacent a face of the chip wherein the electro-osmotic pump and the cooling channel are in separate layers of material attached to the face of the chip and wherein electrical power for the electro-osmotic pumps is conducted by electrical conductors formed through the electronics chip.

14. An apparatus comprising:
an electronics chip; and
an electro-osmotic pump for circulating cooling fluid through cooling channels adjacent a face of the chip wherein the electro-osmotic pump and the cooling channels are in the same layer of material and wherein electrical power for the electro-osmotic pumps is conducted by electrical conductors formed through the electronics chip.

15. The apparatus of claim 14, wherein the electro-osmotic pump and the cooling channel are in substantially the same plane.

* * * * *

UNITED STATES PATENT AND TRADEMARK OFFICE
CERTIFICATE OF CORRECTION

PATENT NO. : 7,355,277 B2 Page 1 of 1
APPLICATION NO. : 10/750224
DATED : April 8, 2008
INVENTOR(S) : Myers et al.

It is certified that error appears in the above-identified patent and that said Letters Patent is hereby corrected as shown below:

On the title page, in field (74), under "Attorney, Agent, or Firm", in column 2, line 2, after "Woessner" insert -- , --.

In column 17, line 9, in Claim 9, delete "face." and insert -- face, --, therefor.

Signed and Sealed this

Fifth Day of August, 2008

JON W. DUDAS
*Director of the United States Patent and Trademark Office*